US008658958B2

(12) United States Patent
Lan et al.

(10) Patent No.: US 8,658,958 B2
(45) Date of Patent: Feb. 25, 2014

(54) LIGHT SENSING CIRCUIT HAVING PROGRAMMABLE CURRENT SOURCE AND METHOD THEREOF

(75) Inventors: Wei-Ting Lan, Tainan County (TW); Cheng-Chi Yen, Tainan County (TW); Ju-Tien Cheng, Tainan County (TW)

(73) Assignee: Himax Display, Inc., Tainan (TW)

( * ) Notice: Subject to any disclaimer, the term of this patent is extended or adjusted under 35 U.S.C. 154(b) by 691 days.

(21) Appl. No.: 12/688,194

(22) Filed: Jan. 15, 2010

(65) Prior Publication Data

US 2010/0252720 A1 Oct. 7, 2010

(30) Foreign Application Priority Data

Apr. 6, 2009 (TW) ................................ 98111360 A

(51) Int. Cl.
H03F 3/08 (2006.01)
G01J 1/44 (2006.01)

(52) U.S. Cl.
USPC .................................. 250/214 A; 250/214 C

(58) Field of Classification Search
USPC ........ 250/214.1, 214 R, 214 A, 206, 214 AL, 250/214 C; 327/514, 362, 363, 515; 340/600; 330/288, 59, 257, 265, 307; 348/227.1, 602
See application file for complete search history.

(56) References Cited

U.S. PATENT DOCUMENTS

| | | | | |
|---|---|---|---|---|
| 4,660,075 A * | 4/1987 | Hashimoto et al. | ........ | 348/226.1 |
| 4,750,216 A * | 6/1988 | Boyce | ............................ | 398/140 |
| 5,500,792 A * | 3/1996 | Jeon et al. | ........................ | 363/98 |
| 6,002,157 A * | 12/1999 | Kozuka | .......................... | 257/369 |
| 6,417,656 B1 * | 7/2002 | Shirai | ............................ | 323/316 |
| 7,253,391 B2 * | 8/2007 | Koyama et al. | ............ | 250/214 C |
| 7,265,333 B2 * | 9/2007 | Ichino et al. | ............... | 250/214 R |
| 2005/0073489 A1 * | 4/2005 | Suzunaga et al. | ................ | 345/84 |
| 2005/0147011 A1 * | 7/2005 | Esaki et al. | ................. | 369/53.37 |
| 2008/0068583 A1 * | 3/2008 | Hiraide | ......................... | 356/4.01 |

FOREIGN PATENT DOCUMENTS

| | | | | | |
|---|---|---|---|---|---|
| JP | 2003163413 A | * | 6/2003 | ............ | H01S 5/0683 |
| JP | 2005-121367 | | 5/2005 | | |
| JP | 2008-309750 | | 12/2008 | | |
| TW | 200914803 | | 4/2009 | | |

OTHER PUBLICATIONS

"First Office Action of China counterpart application" issued on Mar. 19, 2012, p. 1-p. 5, in which the listed references were cited.
"Office Action of Taiwan Counterpart Application", issued on Jun. 3, 2013, p. 1-p. 12, in which the listed reference was cited.

* cited by examiner

*Primary Examiner* — Que T Le
*Assistant Examiner* — Jennifer Bennett
(74) *Attorney, Agent, or Firm* — J.C. Patents

(57) ABSTRACT

A light detecting circuit and a light detecting method thereof are provided. The light detecting circuit includes a first resistor, a light sensor, a current source, and a first current mirror. The light sensor generates a corresponding photocurrent according to the illumination while being illuminated by the high brightness light beam. By dividing the photocurrent corresponding to the low brightness light beam from the photocurrent through the current source, the light detecting circuit can mainly detects the high brightness light beam, so that the detecting accuracy can be enhanced. Accordingly, when being applied to detect the high brightness light beam, the light detecting circuit can provide a sensing voltage in a wide enough range and a large enough sense scale, so that the sensing voltage is easy to be distinguished by the rear stage.

6 Claims, 8 Drawing Sheets

LIGHT SENSING CIRCUIT HAVING PROGRAMMABLE CURRENT SOURCE AND METHOD THEREOF

CROSS-REFERENCE TO RELATED APPLICATION

This application claims the priority benefit of Taiwan application serial no. 98111360, filed on Apr. 6, 2009. The entirety of the above-mentioned patent application is hereby incorporated by reference herein and made a part of specification.

BACKGROUND OF THE INVENTION

1. Field of the Invention

The invention relates to a detecting circuit and a method thereof, and more particularly to a light detecting circuit and a method thereof.

2. Description of Related Art

In the current display market, either the cathode ray tube (CRT) or the liquid crystal display (LCD) can not provide a large frame yet due to the limitation of the process. In addition, for the projector, the large frame is projected on the screen through a light source, e.g. a lamp, and a plurality of lenses. Accordingly, the large frame of 100~200 inches can be easily projected by the projector in the inner space.

However, in the past, a dark inner space is necessary for the projector because the brightness of the light source in the projector is insufficient. With the progress in science and technology, the light emitting diode (LED) is applied to the projector to solve the issue. The LED has the advantages of high brightness, low power consumption, small volume, long lifespan, and so on. Accordingly, when the LED serves as the light source of the projector, the projector can project a clear frame even if in a bright inner space.

In order to stabilize the brightness of the light beam emitted by the LED, a feedback control mechanism is used when the LED serves as the light source. In the feedback control mechanism, the brightness of the LED is detected, and the current flowing through the LED is adjusted. FIG. 1 is a schematic diagram of a conventional light detecting circuit. Referring to FIG. 1, the light detecting circuit 100 is applied to the feedback control mechanism of the projector. The light detecting circuit 100 includes a light sensor 101, a current mirror 103, and a sensing resistor $R_{SEN}$. The current mirror 103 is formed by PMOS transistors $Q_1$ and $Q_2$. When being illuminated by the light beam emitted by the LED, the light sensor 101 generates a corresponding photocurrent according to the illumination of the light beam. The current mirror 103 generates a mirror current I flowing through the resistor $R_{SEN}$ according to the photocurrent, so that a voltage drop $V_{SEN}$ across the resistor $R_{SEN}$ is generated. Because the voltage drop $V_{SEN}$ is proportional to the illumination of the light beam emitted by the LED, the illumination thereof can be obtained by measuring the voltage drop $V_{SEN}$.

Accordingly, when the light sensor 101 senses a light beam with the high illumination, the mirror current I generated by the current mirror 103 and the voltage drop $V_{SEN}$ are both large. Hence, according to the equation $V_{SEN}=I \times R_{SEN}$, the resistance of the resistor $R_{SEN}$ is small because the maximum of the is the voltage $V_{DD}$. FIG. 2A and FIG. 2B are characteristic illumination-voltage curves of the light detecting circuit in FIG. 1. Referring to FIG. 2A, the resistance of the resistor $R_B$ is smaller than that of the resistor $R_A$, so that a larger range of the illumination can be detected while the resistor $R_B$ serves as the resistor $R_{SEN}$. However, if the resistance of the resistor Rsen is small, the voltage interval $\Delta V$ corresponding to the illumination interval $\Delta L$ is also small, as shown in FIG. 2B. Accordingly, the resolution of the voltage drop Vsen is reduced, and the illumination of the light beam emitted by the LED can not be determined exactly.

SUMMARY OF THE INVENTION

An embodiment of the invention provides a light detecting circuit and a method thereof capable of widening the detecting range and enhancing the accuracy while detecting the high brightness light source.

An embodiment of the invention provides a light detecting circuit and a method thereof. The light detecting circuit is capable of adjusting the threshold current for the photocurrent corresponding to different color beams when the light detecting circuit is applied to a color sensor.

An embodiment of the invention provides a light detecting circuit including a first resistor, a light sensor, a current source, and a first current mirror. The first resistor has a first end and a second end, and the second end thereof is coupled to a first voltage. The light sensor has a first end and a second end, and the second end thereof is coupled to the first voltage. The current source is coupled to the first end of the first resistor. The first current mirror has a master current end and a slave current end. The slave current end is coupled to the current source and the first end of the first resistor, and the master current end is coupled to the first end of the light sensor.

Another embodiment of the invention provides a light detecting circuit including a first resistor, an operational amplifier, a light sensor, and a current source. The first resistor has a first end and a second end. The operational amplifier has a first input end, a second input end, and an output end. The output end of the operational amplifier is coupled to the second end of the first resistor. The first input end of the operational amplifier is coupled to a first voltage, and the second input end of the operational amplifier is coupled to the first end of the first resistor. The light sensor has a first end and a second end. The first end of the light sensor is coupled to the first end of the first transistor, and the second end of the light sensor is coupled to the first voltage. The current source is coupled to the first end of the light sensor.

In an embodiment of the invention, the first current source includes a first transistor and a bias voltage generating circuit. The first transistor has a control end, a first end, and a second end. The first end of the first transistor is coupled to the second voltage, and the second end of the first transistor is coupled to the first end of the light sensor. The bias voltage generating circuit outputs a bias voltage to the control end of the first transistor.

In an embodiment of the invention, the current source is a programmable current source. The programmable current source is coupled to the second input end of the operational amplifier to provide a programmable current. Moreover, the programmable current source receives a current selection signal from a selection unit to determine an amount of the programmable current.

In an embodiment of the invention, the light sensor is a photodiode array unit. The photodiode array unit includes a photodiode array and a switch unit. The photodiode array includes a plurality of photodiodes, and the photodiode array is coupled to the first voltage to sense color beams and generate a plurality of photocurrents. The switch unit is coupled to the first end of the first resistor. Moreover, the switch unit receives a switch selection signal from the selection unit to determine a total amount of the photocurrents.

In an embodiment of the invention, the selection unit receives a color enable signal and respectively outputs the current selection signal and the switch selection signal to the programmable current source and the switch unit according to the color enable signal and a register table to determine the amount of the programmable current and the total amount of the photocurrents. Herein, the register table stores parameters of driving the programmable current source and the switch unit corresponding to the different color beams.

In an embodiment of the invention, the light detecting circuit further includes a direct-current (DC) bias voltage source. The DC bias voltage source is coupled to the first input end of the operational amplifier.

Another embodiment of the invention provides a light detecting method including following steps. First of all, a light beam is sensed to generate a photocurrent. Next, a predetermined current is subtracted from the photocurrent. Finally, the photocurrent is converted to a voltage.

In an embodiment of the invention, the light detecting method further includes a step of determining the amount of the predetermined current and the amount of the photocurrent according to a color enable signal and a register table.

In an embodiment of the invention, the predetermined current is generated by a programmable current source, and the light beam is sensed by a photodiode array.

In view of the above, when the high brightness light beam illuminates the light sensor, the light sensor generates a corresponding photocurrent according to the illumination thereof. By dividing the photocurrent corresponding to the low brightness light beam from the total photocurrent through the current source, the light detecting circuit can mainly detects the high brightness light beam, so that the detecting accuracy is enhanced. Accordingly, when being applied to detect the high brightness light beam, the light detecting circuit can provide a sensing voltage in a wide enough range and a large enough sense scale, so that the sensing voltage is easy to be distinguished by the rear stage.

To make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
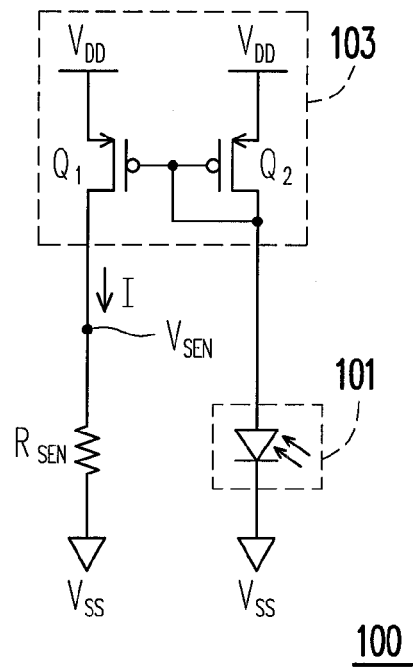
FIG. 1 is a schematic diagram of a conventional light detecting circuit.
Figure 2A:
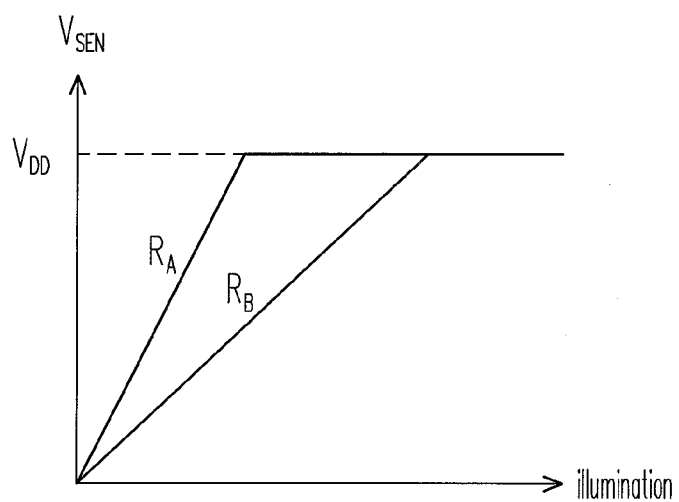
FIG. 2A and FIG. 2B are characteristic illumination-voltage curves of the light detecting circuit in FIG. 1.
Figure 2B:
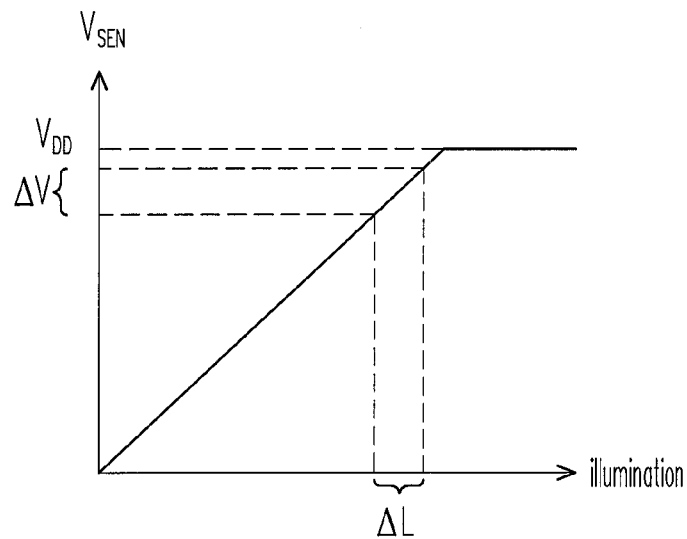
Figure 3:
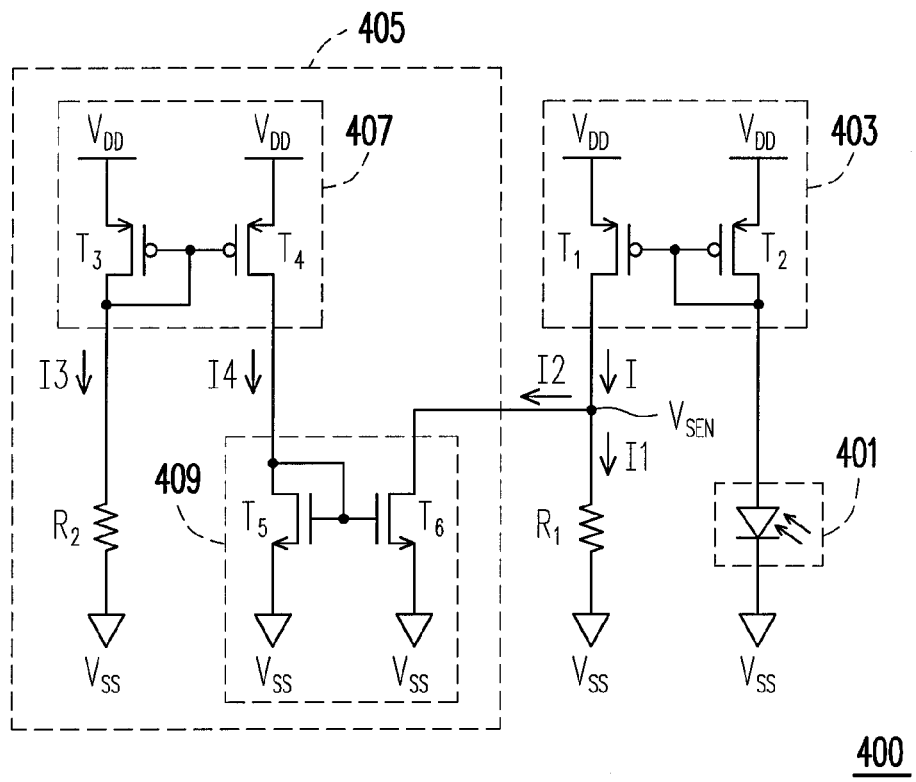
FIG. 3 is a schematic diagram of a light detecting circuit according to an embodiment of the invention.

FIG. 3 is a schematic diagram of a light detecting circuit according to an embodiment of the invention. Referring to FIG. 3, the light detecting circuit 400 includes a light sensor 401, a first current mirror 403, a first resistor $R_1$, and a current source 405. In the present embodiment, the light sensor 401 is a photodiode, but the invention is not limited thereto. The first end of the light sensor 401, e.g. the positive end, is coupled to the master current end of the first current mirror 403. The second end of the light sensor 401, e.g. the negative end, is coupled to a first voltage. In this case, the voltage $V_{SS}$ is used to serve as the first voltage. The first end of the first resistor $R_1$ is coupled to the slave current end of the first current mirror 403, and the second end of the first resistor $R_1$ is coupled to the voltage $V_{SS}$. The current source 405 is coupled to the first end of the first resistor $R_1$.

The first current mirror 403 includes a first transistor $T_1$ and a second transistor $T_2$. In the present embodiment, the transistors $T_1$ and $T_2$ may be p-channel metal-oxide-semiconductor transistors (PMOS transistors). Herein, the first end of the transistor $T_1$ is coupled to a second voltage, i.e. the voltage $V_{DD}$, and the control end of the transistor $T_1$, e.g. the gate, is coupled to the control end and the second end of the transistor $T_2$, e.g. the gate and the drain. Moreover, the second end of the transistor $T_1$, e.g. the drain, serves as the slave current end of the current mirror 403 to be coupled to the first end of the first resistor $R_1$. The first end of the transistor $T_2$ is coupled to the voltage $V_{DD}$, and the drain of the transistor $T_2$ serves as the master current end of the first current mirror 403 to be coupled to the positive end of the light sensor 401.

In present embodiment of the invention, the current source 405 includes a second resistor $R_2$, a second current mirror 407, and a third current mirror 409. The current mirror 407 includes a third transistor $T_3$ and a fourth transistor $T_4$. In the present embodiment, the transistors $T_3$ and $T_4$ may be PMOS transistors. Herein, the first end of the transistor $T_3$, e.g. the source, is coupled to the voltage $V_{DD}$, and the control end of the transistor $T_3$, e.g. the gate, is coupled to the second end of the transistor $T_3$, e.g. the drain. The control end of the transistor $T_4$, e.g. the gate, is coupled to the gate of the transistor $T_3$, and the first end of the transistor $T_4$, e.g. the source, is coupled to the voltage $V_{DD}$. The drain of the transistor $T_3$ is the master current end of the current mirror 407, and the second end of the transistor $T_4$, e.g. the drain, is the slave current end of the current mirror 407. The first end of the resistor $R_2$ is coupled to the drain of the transistor $T_3$, and the second end of the resistor $R_2$ is coupled to is coupled to the voltage $V_{SS}$.

The current mirror 409 includes a fifth transistor $T_5$ and a sixth transistor $T_6$. In the present embodiment, the transistors $T_5$ and $T_6$ may be NMOS transistors. Herein, the second end of the transistor $T_5$, e.g. the source, is coupled to the voltage $V_{SS}$, and the control end of the transistor $T_5$, e.g. the gate, is coupled to the first end of the transistor $T_5$, e.g. the drain. The control end of the transistor $T_6$, e.g. the gate, is coupled to the gate of the transistor $T_5$, and the first end of the transistor $T_6$, e.g. the drain, is coupled to the first end of the resistor $R_1$. Furthermore, the second end of the transistor $T_6$, e.g. the source, is coupled to the voltage $V_{SS}$. The drain of the transistor $T_5$ is the master current end of the current mirror 409, and the drain of the transistor $T_6$ is the slave current end of the current mirror 409.

The resistor $R_2$ is used to limit the amount of the current $I_3$. The current mirror 407 generates the mirror current $I_4$ according to the current $I_3$, and the current mirror 409 generates the mirror current $I_2$ according to the current $I_4$. That is, the resistor $R_2$ can determines the amount of the current $I_2$. Accordingly, while being illuminated by the light beam, the light sensor 401 generates the photocurrent, so that the current mirror 403 correspondingly generates the mirror current I. The mirror current I is divided into the current $I_1$ and $I_2$. The current $I_1$ flows through the resistor $R_1$, and the current $I_2$ flows through the current source 405. In the present embodiment, while the light sensor 401 is illuminated by the low brightness light beam, the amount of the current I is smaller than the amount of the current $I_2$. That is, the current I is fully sank by the current source 405, so that the amount of the current $I_1$ flowing through the resistor $R_1$ is zero. Accordingly, the current $I_2$ can be set as the threshold current while the light sensor 401 is illuminated by the low brightness light beam.

Figure 4:
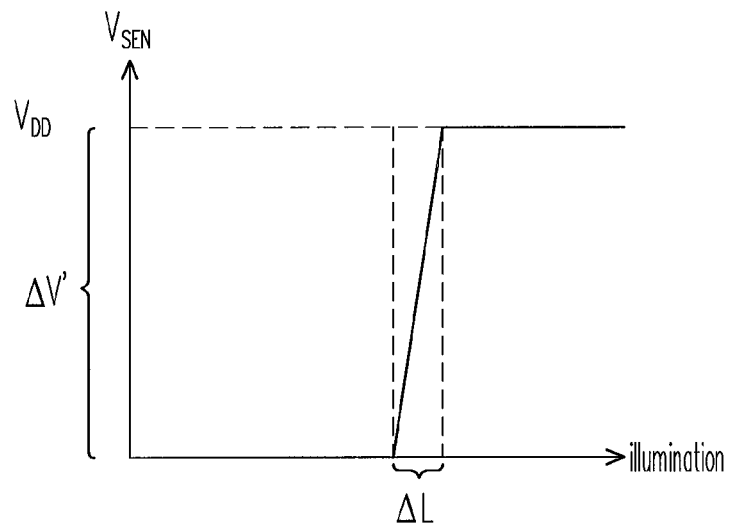
FIG. 4 is a characteristic illumination-voltage curve of the light detecting circuit in FIG. 3.

In the present, while the light sensor 401 is illuminated by the high brightness light beam, the amount of the current I is larger than the amount of the current $I_2$. As a result, the part of the current I is sank by the current source 405, and the rest of the current I, i.e. the current $I_1$ equal to $I-I_2$, flows through the resistor $R_1$. Meanwhile, a voltage drop across the resistor $R_1$, i.e. the sensing voltage $V_{sen}$ in FIG. 3, is generated by the current $I_1$ flowing through the resistor $R_1$. FIG. 4 is a characteristic illumination-voltage curve of the light detecting circuit in FIG. 3. As shown in FIG. 4, the voltage interval $\Delta V'$ corresponding to the illumination interval $\Delta L$ varies between the voltages 0 and $V_{DD}$. In other word, in the present embodiment, the light detecting circuit 400 can provide an exact accuracy and a high resolution for light detecting while being illuminated by the high brightness light beam. The brightness of the light emitting diode (LED) can be obtained by measuring the sensing voltage $V_{sen}$, so that the sensing voltage $V_{sen}$ may be fed back to the control circuit (not shown) to control the illumination of the light source (not shown).

Figure 5:
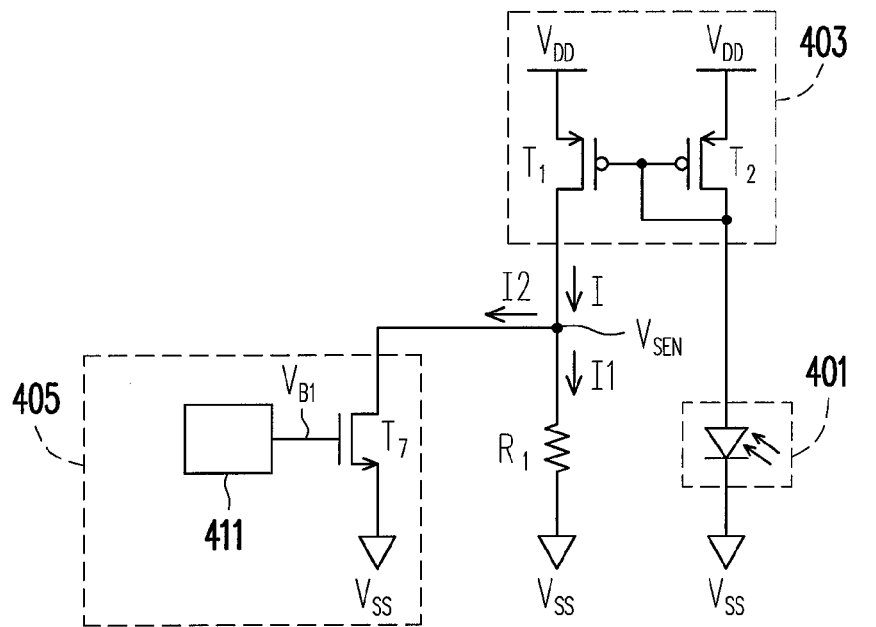
FIG. 5 is a schematic diagram of a light detecting circuit according to another embodiment of the invention.

FIG. 5 is a schematic diagram of a light detecting circuit according to another embodiment of the invention. Referring to FIG. 3 and FIG. 5, the light detecting circuit 500 is similar to the light detecting circuit 400, and the difference between the light detecting circuits 400 and 500 will be described as follows. Referring to FIG. 5, the current source 405 includes a seventh transistor $T_7$ and a bias voltage generating circuit 411. In the present embodiment, the transistor $T_7$ may be an NMOS transistor. Herein, the first end of the transistor $T_7$, e.g. the drain, is coupled to the first end of the resistor $R_1$, and the second end of the transistor $T_7$, e.g. the source, is coupled to the voltage $V_{SS}$. Moreover, the bias voltage generating circuit 411 may be a band gap voltage circuit. It should be known to those ordinary skilled in the art that the band gap voltage circuit is a voltage circuit with an adjustable temperature coefficient, which can steady output a band gap voltage without being affected due to the change of the temperature. In the present embodiment, the bias voltage generating circuit 411 is coupled to the gate of the transistor $T_7$ to output the bias voltage $V_{B1}$. The bias voltage $V_{B1}$ is used to drive the transistor $T_7$ to generate/sink the current $I_2$.

Figure 6:
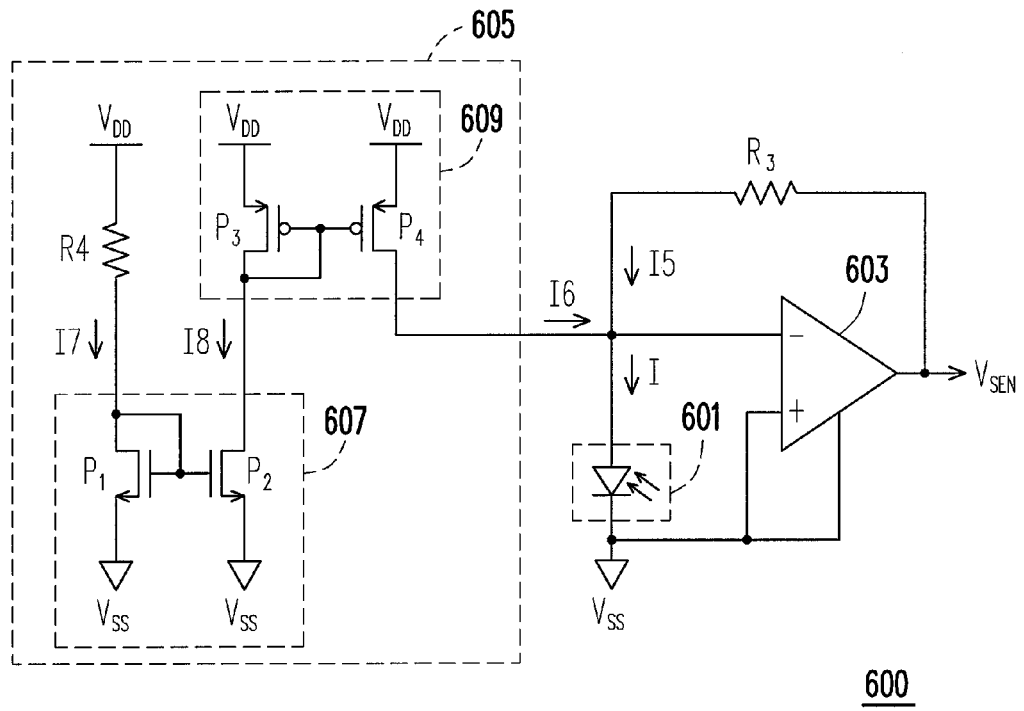
FIG. 6 is a schematic diagram of a light detecting circuit according to an embodiment of the invention.

FIG. 6 is a schematic diagram of a light detecting circuit according to another embodiment of the invention. Referring to FIG. 6, the light detecting circuit 600 includes a first resistor $R_3$, an operational amplifier 603, a light sensor 601, and a current source 605. In the present embodiment, the light sensor 601 is a photodiode, but the invention is not limited thereto. The output end of the operational amplifier 603 is coupled to the second end of the resistor $R_3$, and outputs the sensing voltage $V_{sen}$ to the control circuit (not shown) to control the illumination of the light source (not shown). The first input end of the operational amplifier 603 may be a non-inverting end, denoted as "+", coupled to the voltage $V_{SS}$. The first input end of the operational amplifier 603 may be an inverting end, denoted as "−", coupled to the first end of the resistor $R_3$. The first end of the light sensor 601, e.g. the positive end, is coupled to the first end of the resistor $R_3$, and the second end of the light sensor 601, e.g. the negative end, is coupled to the voltage $V_{SS}$.

The current source 605 includes a second resistor $R_4$, a first current mirror 607, and a second current mirror 609. The first end of the resistor $R_4$ is coupled to the voltage $V_{DD}$. The current mirror 607 includes a first transistor $P_1$ and a second transistor $P_2$. In the present embodiment, the transistors $P_1$ and $P_2$ may be NMOS transistors. Herein, the first end of the transistor $P_1$, e.g. the drain, is coupled to the second end of the resistor $R_4$, and the second end of the transistor $P_1$, e.g. the source, is coupled to the voltage $V_{SS}$. Moreover, the control end of the transistor $P_1$, e.g. the gate, is coupled to the drain of the transistor $P_1$. The control end of the transistor $P_2$, e.g. the gate, is coupled to the gate of the transistor $P_1$, and the second end of the transistor $P_2$, e.g. the source, is coupled to the voltage $V_{SS}$. The drain of the transistor $P_1$ is the master current end of the current mirror 607, and the first end of the transistor $P_2$, e.g. the drain, is the slave current end of the current mirror 607.

The current mirror 609 includes a third transistor $P_3$ and a fourth transistor $P_4$. In the present embodiment, the transistors $P_3$ and $P_4$ may be PMOS transistors. Herein, the first end of the transistor $P_3$, e.g. the source, is coupled to the voltage $V_{DD}$, and the control end of the transistor $P_3$, e.g. the gate, is coupled to the drain of the transistor $P_3$. Moreover, the second end of the transistor $P_3$, e.g. the drain, is coupled to the drain of the transistor $P_2$. The first end of the transistor $P_4$, e.g. the source, is coupled to the voltage $V_{DD}$, and the control end of the transistor $P_4$, e.g. the gate, is coupled to the gate of the transistor $P_3$. Moreover, the second end of the transistor $P_4$, e.g. the drain, is coupled to the positive end of the light sensor 601. The drain of the transistor $P_3$ is the master current end of the current mirror 609, and the drain of the transistor $P_4$ is the slave current end of the current mirror 609.

As shown in FIG. 6, the resistor $R_4$ is used to limit the amount of the current $I_7$. The current mirror 607 generates the mirror current $I_5$ according to the current $I_7$, and the current mirror 409 generates the mirror current $I_6$ according to the current $I_8$. In the present embodiment, the light detecting circuit 600 is a circuit with an inverting close-loop amplifier, but the invention is not limited thereto. Referring to FIG. 3 and FIG. 6, the operation of the light detecting circuit 600 is similar to that of the light detecting circuit 400. Referring to FIG. 6, while the light sensor 601 is illuminated by the high brightness light beam, the amount of the current I is larger than the amount of the current $I_6$. The part of the current I is provided by the current source 605, and the rest of the current I is provided by the current $I_5$. Meanwhile, a voltage drop across the resistor $R_3$ is generated by the current $I_5$ flowing through the resistor $R_3$, thereby generating a sensing voltage $V_{sen}$ at the output end of the operational amplifier 603. As known from the characteristic illumination-voltage curve illustrated in FIG. 4, the illumination of the light source can be obtained from the corresponding sensing voltage $V_{sen}$.

Figure 7:
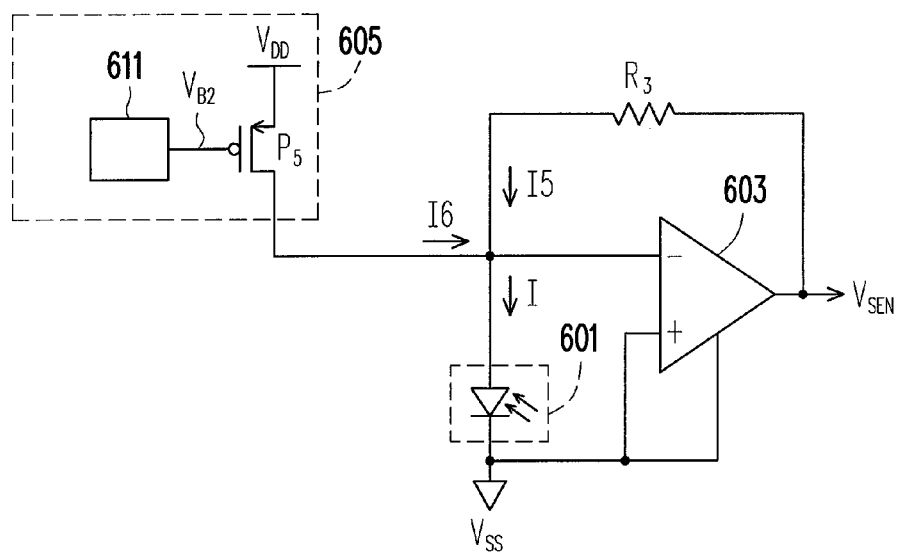
FIG. 7 is a schematic diagram of a light detecting circuit according to an embodiment of the invention.

FIG. 7 is a schematic diagram of a light detecting circuit according to another embodiment of the invention. Referring to FIG. 6 and FIG. 7, the light detecting circuit 700 is similar to the light detecting circuit 600, and the difference between the light detecting circuits 600 and 700 will be described as follows. Referring to FIG. 7, the current source 605 includes a fifth transistor $P_5$ and a bias voltage generating circuit 611. In the present embodiment, the transistor $P_5$ may be a PMOS transistor. Herein, the first end of the transistor $P_5$, e.g. the source, is coupled to the voltage $V_{DD}$, and the second end of the transistor $P_5$, e.g. the drain, is coupled to the positive end of the light sensor 601. Moreover, the bias voltage generating circuit 611 may be a band gap voltage. The bias voltage generating circuit 611 is coupled to the control end of the transistor $P_5$, e.g. the gate, and configured to output the bias voltage $V_{B2}$, i.e. the band gap voltage to drive the transistor $P_5$ to steady generate the current $I_6$.

Figure 8:
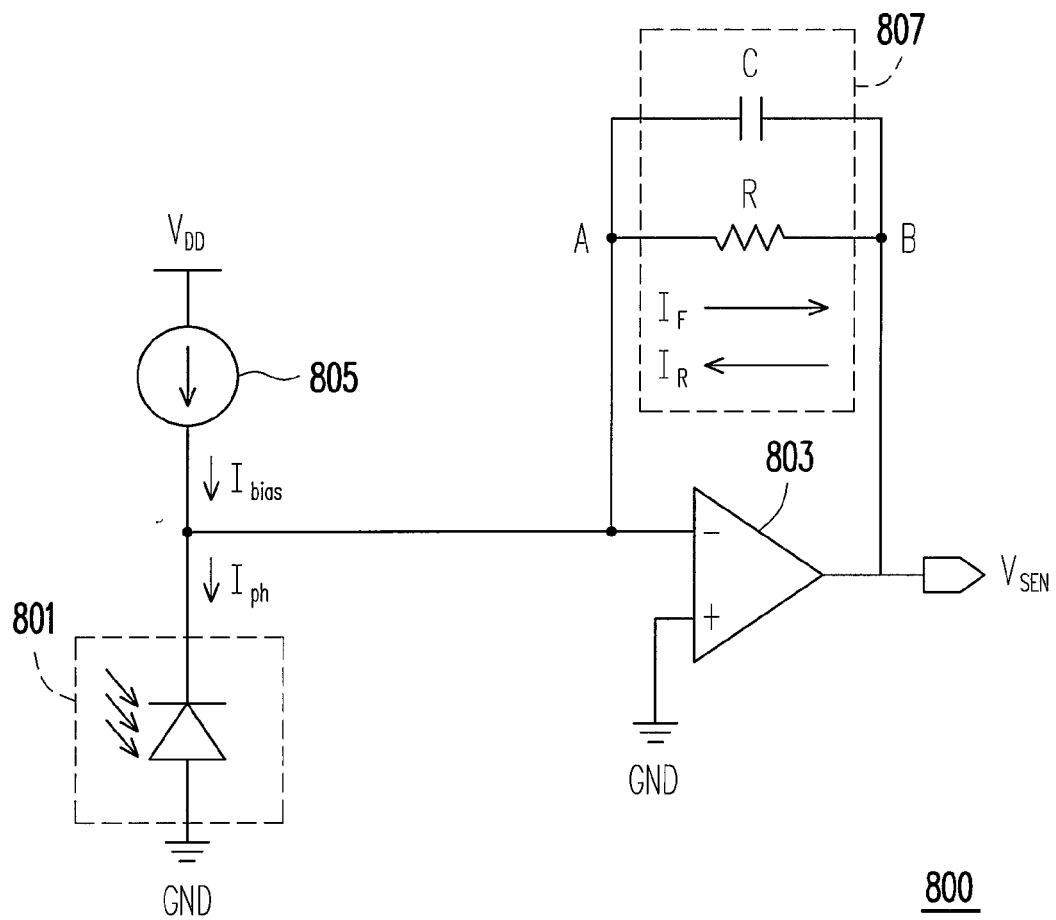
FIG. 8 is a schematic diagram of a light detecting circuit according to an embodiment of the invention.

FIG. 8 is a schematic diagram of a light detecting circuit according to another embodiment of the invention. Referring to FIG. 8, the light detecting circuit 800 includes a light sensor 801, an operational amplifier 803, a current source 805, and a feedback impedance unit 807. In the present embodiment, the feedback impedance unit 807 includes a feedback resistor R and a feedback capacitor C. Herein, the feedback resistor R determines the loop gain of the operational amplifier 803 converting the photocurrent $I_{ph}$ to the sensing voltage $V_{SEN}$, and the feedback capacitor C is used to prevent the circuit system from being unstable and avoid the issue related to the circuit oscillation.

The output end of the operational amplifier 803 is coupled to the second end B of the feedback impedance unit 807, and outputs the sensing voltage $V_{SEN}$ to the rear stage, e.g. an A/D converter (not shown). The first input end of the operational amplifier 803 may be a non-inverting end, denoted as "+", coupled to the ground GND. The second input end of the operational amplifier 803 may be an inverting end, denoted as "−", coupled to the first end A of the feedback impedance unit 807.

In the present embodiment, the N+/P-Well photodiode is exemplary for the light sensor 801. The first end of the light sensor 801, e.g. the cathode end, is coupled to the first end A of the feedback impedance unit 807, and the second end thereof, e.g. the anode end, is coupled to the ground GND. Moreover, there is no direct voltage drop between the two ends of the photodiode, and thus, the dark current is not generated, so that the light detecting circuit 800 has the higher signal-to-noise ratio and the better sensitivity.

It should be noted that, the light detecting circuit 800 of the present embodiment includes the current source 805 which is coupled to the cathode end of the photodiode, and the threshold current is set through the current source 805. It will be described in detail later. In other embodiments, the light sensor 801 may be a P+/N-Well photodiode, and the current source 805 is coupled to the anode end of the photodiode. Furthermore, in the present embodiment, the light detecting circuit 800 is a circuit with an inverting close-loop amplifier, but the invention is not limited thereto.

Figure 9:
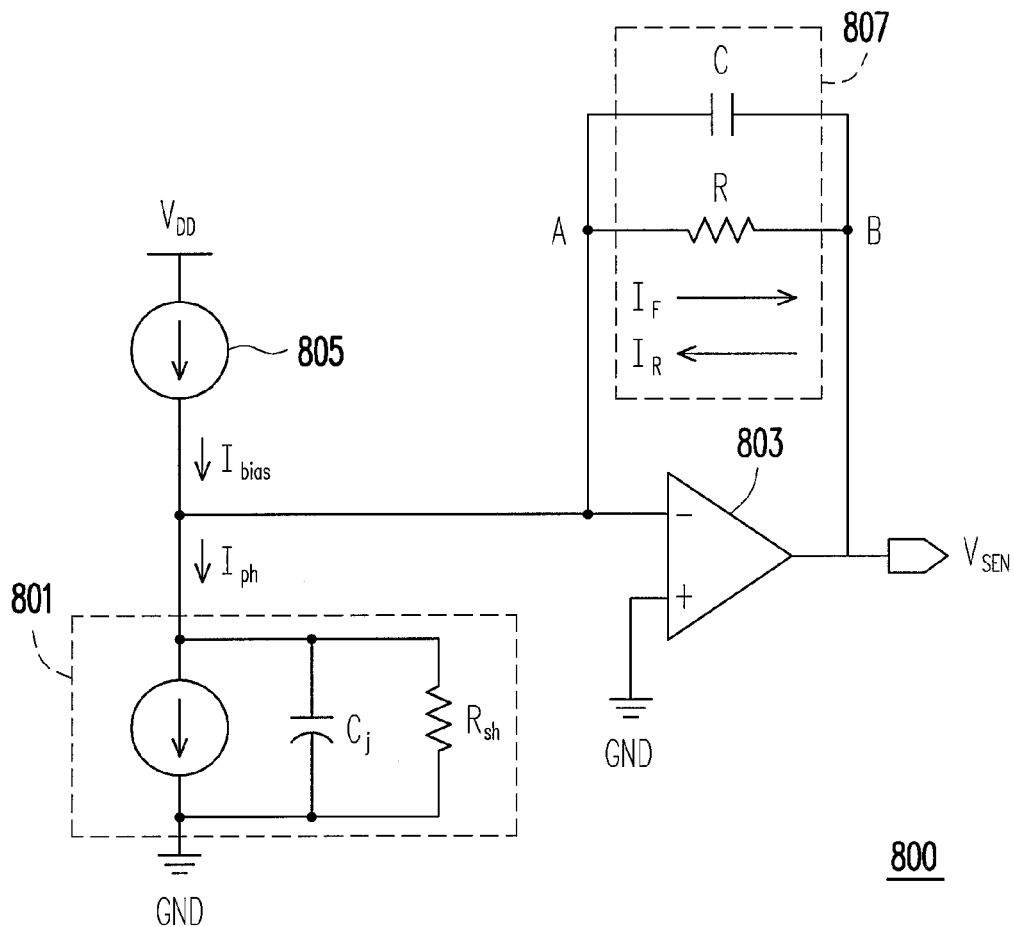
FIG. 9 is a circuit diagram of the light detecting circuit in FIG. 8, in which the light sensor 801 is shown as an equipment circuit of the photodiode.

FIG. 9 is a circuit diagram of the light detecting circuit in FIG. 8, in which the light sensor 801 is shown as an equipment circuit of the photodiode. Herein, the equipment circuit of the photodiode includes a photocurrent $I_{ph}$, an equipment capacitor $C_j$, and an equipment resistor $R_{sh}$. Referring to FIG. 9, in the present embodiment, the current source 805 provides a bias current $I_{bias}$ to set the threshold current. When the brightness of the light beam reaches to a specific value, the light sensor 801 can generate a photocurrent $I_{ph}$ larger than the threshold current. In such a case, the photocurrent $I_{ph}$ can be converted to the sensing voltage $V_{SEN}$. On the contrary, if the photocurrent $I_{ph}$ generated by the light sensor 801 is smaller than the threshold current, the function of converting the photocurrent $I_{ph}$ to the sensing voltage $V_{SEN}$ is cut off to filter out the photocurrent corresponding to the low brightness light beam. That is, the light sensor generates a corresponding photocurrent according to the illumination while being illuminated by the high brightness light beam. By dividing the photocurrent corresponding to the low brightness light beam from the total photocurrent through the current source, the light detecting circuit can mainly detects the high brightness light beam, so that the detecting accuracy can be enhanced.

Figure 10:
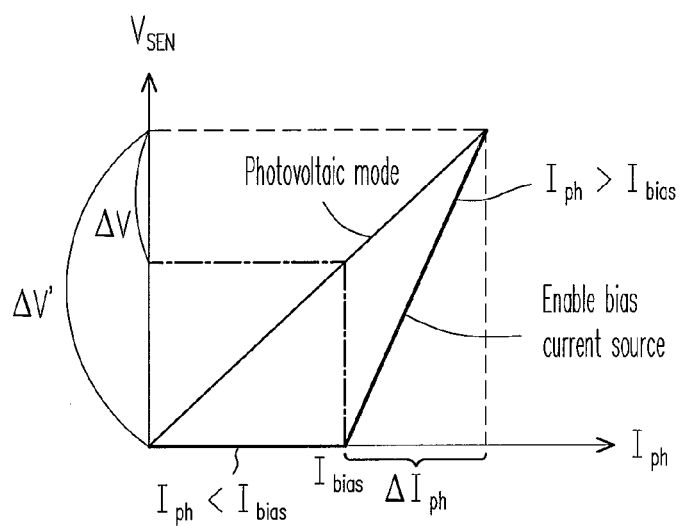
FIG. 10 illustrates characteristic I-V curves of the light detecting circuit in FIG. 9.

Specifically, FIG. 10 illustrates characteristic I-V curves of the light detecting circuit in FIG. 9. Referring to FIG. 9 and FIG. 10, in the present embodiment, the N+/P-Well photodiode is exemplary for the light sensor 801, and the threshold current is set as the bias current $I_{bias}$. When the photodiode is illuminated by the light beam, if the photocurrent $I_{ph}$ generated by the photodiode is smaller than the bias current $I_{bias}$, a forward current $I_F$ flowing through the feedback resistor R is generated. At this time, the sensing voltage $V_{SEN}$ does not change with the photocurrent $I_{ph}$. On the contrary, if the photocurrent $I_{ph}$ generated by the photodiode is larger than the bias current $I_{bias}$, a reverse current $I_R$ flowing through the feedback resistor R is generated. At this time, the sensing voltage $V_{SEN}$ change with the photocurrent $I_{ph}$ in the linear manner.

As a result, the voltage interval $\Delta V$ is increased to the voltage interval $\Delta V'$, so that the sensing voltage $V_{SEN}$ changes between the voltages 0 and $V_{DD}$, and the slope $\Delta V/\Delta I_{ph}$ of the I-V curve in the photovoltaic mode is changed to the slope $\Delta V'/\Delta I_{ph}$ of the I-V curve while the bias current source is enabled. Accordingly, the light detecting circuit of the embodiment can widen the detecting range and enhance the accuracy while detecting the high brightness light source. That is, the light sensor generates a corresponding photocurrent according to the illumination while being illuminated by the high brightness light beam. By dividing the photocurrent corresponding to the low brightness light beam from the total photocurrent through the current source, the light detecting circuit can mainly detects the high brightness light beam, so that the detecting accuracy can be enhanced. Accordingly, when being applied to detect the high brightness light beam, the light detecting circuit can provide a sensing voltage in a wide enough range and a large enough sense scale, so that the sensing voltage is easy to be distinguished by the rear stage.

It should be noted that, in the present embodiment, the bias current $I_{bias}$ provided by the current source 805 can be set as zero, so that the light detecting circuit operates in the photovoltaic mode.

Figure 11:
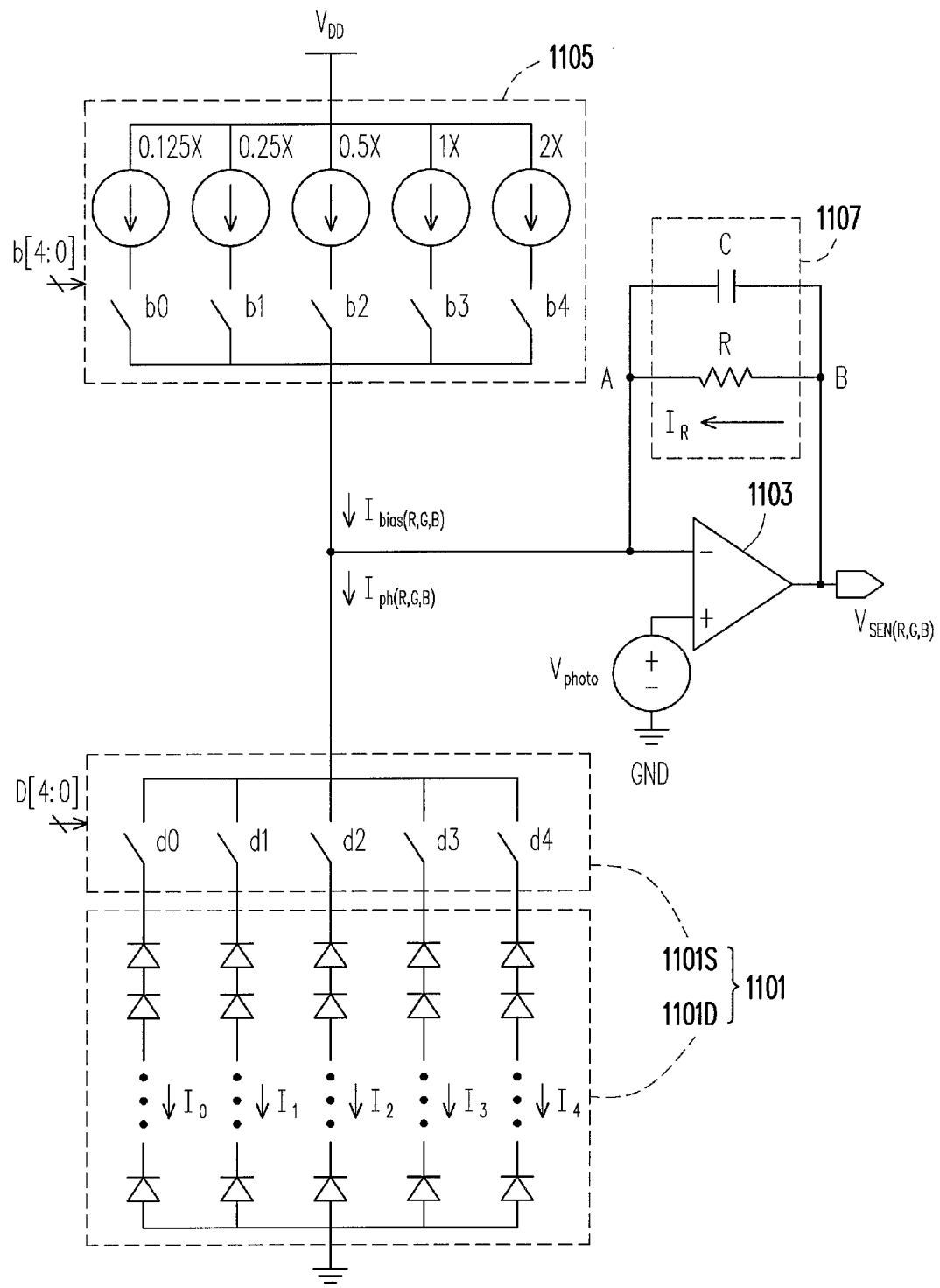
FIG. 11 is a schematic diagram of a light detecting circuit according to another embodiment of the invention.
Figure 12:
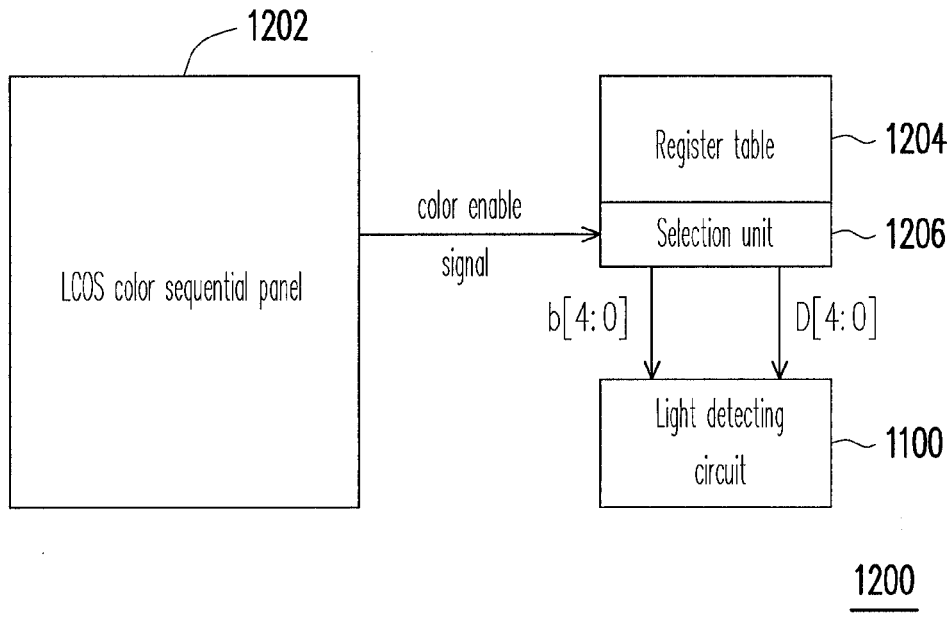
FIG. 12 is a block diagram of an LCOS color sequential display system according to an embodiment of the invention.

FIG. 11 is a schematic diagram of a light detecting circuit according to another embodiment of the invention. FIG. 12 is a block diagram of an LCOS color sequential display system according to an embodiment of the invention. Herein, the light detecting circuit 1100 of FIG. 11 serves as a color sensor of the LCOS color sequential display system 1200. Referring to FIG. 11 and FIG. 12, the light detecting circuit 1100 is similar to the light detecting circuit 800, and the difference between the light detecting circuits 1100 and 800 will be described as follows.

In the present embodiment, the current source 1105 is a programmable current source. The programmable current source 1105 is coupled to the inverting end of the operational amplifier and provides a programmable current as the bias current, so that the threshold current can be freely set. The light sensor 1101 is a photodiode array unit including a switch unit 1101S and a photodiode array 1101D. The photodiode array 1101D is used to sense the light beams with different colors and generate a plurality of photocurrents $I_0$-$I_4$. The switch unit 1101S control the summation of the photocurrents $I_0$-$I_4$ through the switches $d_0$-$d_4$ which are coupled to the corresponding photodiode strings in series.

As known from FIG. 12, the LCOS color sequential display system 1200 includes an LCOS color sequential panel 1202, a register table 1204, a selection unit 1206, and the light detecting circuit 1100. Herein, the light detecting circuit 1100 serves as a color sensor of the LCOS color sequential display system 1200. The operation of the LCOS color sequential display system is well known to those skilled in the art, and it will not be described herein.

When the light detecting circuit 1100 serves as the color sensor of the LCOS color sequential display system 1200, the threshold current can be set corresponding to the different color beams, and the photodiode strings can be turned on or off in the light detecting circuit 1100. Accordingly, it is unnecessary to design a plurality of corresponding color sensing circuits for the different color beams, so that the cost of the circuit can be reduced. Also, in this case, when being applied to detect the high brightness light beam, the light detecting circuit can provide a sensing voltage in a wide enough range and a large enough sense scale, so that the sensing voltage is easy to be distinguished by the rear stage.

Specifically, the sensitivity of the photodiodes for different color beams is different, and it is usually the red beam, the blue beam, and the green beam in turns. That is, when the photodiodes are illuminated by different color beams with the same brightness, the size of the photocurrents generated by different color beams, from large to small, are the red beam, the blue beam, and the green beam. Accordingly, when the light detecting circuit 1100 serves as the color sensor of the LCOS color sequential display system 1200, it is required to set the threshold currents corresponding to the different color beams, and turned on or off the corresponding photodiode strings.

For example, when the light detecting circuit 1100 senses the red beam, the programmable current source 1105 provides a bias current $I_{bias(R)}$ as the threshold current for the red beam. At this time, if the photocurrent $I_{ph(R)}$ generated by the photodiodes for sensing the red beam is larger than the threshold current $I_{bias(R)}$, the sensing voltage $V_{SEN(R)}$ change with the photocurrent $I_{ph(R)}$ in the linear manner. Next, when the light detecting circuit 1100 senses the green beam, the programmable current source 1105 provides a bias current $I_{bias(G)}$ as the threshold current for the green beam. At this time, if the photocurrent $I_{ph(R)}$ generated by the photodiodes for sensing the green beam is larger than the threshold current $I_{bias(G)}$, the sensing voltage $V_{SEN(G)}$ change with the photocurrent $I_{ph(G)}$ in the linear manner.

In the present embodiment, in order to provide the sensing voltages in a wide enough range and a large enough sense scale for all of the different color beams, it is required to set the threshold currents $I_{bias(G)}$ and $I_{bias(R)}$ to be approximate or to be equal while the light detecting circuit 1100 operates. However, the sensitivity of the photodiodes for the red beam is greater than that of the photodiodes for the green beam. Accordingly, by adjusting the switch unit 1101S in the photodiode array unit 1101, all of the generated photocurrents can larger than the corresponding threshold currents while the light detecting circuit 1100 detects different color beams.

For example, in order to make the photocurrent $I_{ph(G)}$ be larger than the threshold currents $I_{bias(G)}$, when the light detecting circuit 1100 detects the green color beam, the switches $d_0$-$d_4$ can be switched, so that the amount of the photodiodes turned on for the green beam in the photodiode array 1101D is more than the amount of the photodiodes turned on for the red beam when the light detecting circuit 1100 detects the red color beam.

Similarly, in order to make the photocurrent $I_{ph(B)}$ be larger than the threshold currents $I_{bias(B)}$, when the light detecting circuit 1100 detects the blue beam, the switches $d_0$-$d_4$ can be switched, so that the amount of the photodiodes turned on for the blue beam in the photodiode array 1101D is more than the amount of the photodiodes turned on for the red beam when the light detecting circuit 1100 detects the red beam, but less than the amount of the photodiodes turned on for the green beam when the light detecting circuit 1100 detects the green beam. Accordingly, when being applied to detect the high brightness light beams with different colors, the light detecting circuit can provide the sensing voltages in a wide enough range and a large enough sense scale, so that the sensing voltages are easy to be distinguished by the rear stage.

In the present embodiment, the programmable current source 1105 receives a current selection signal b[4:0] from a selection unit 1206 to determine the amount of the programmable current $I_{bias}$, i.e. the threshold current. The switch unit 1101S receives a switch selection signal D[4:0] from the selection unit 1206 to determine the amount of the photodiodes to be turned on when the light detecting circuit 1100 detects different color beams, thereby controlling the total amount of the photocurrents.

Moreover, the register table 1204 stores parameters of driving the programmable current source 1105 and the switch unit 1101 corresponding to different color beams, such as the threshold currents corresponding to different color beams, and the amount of the photodiodes to be turned on when the light detecting circuit 1100 detects different color beams. When receiving the color enable signal provided by the LCOS color sequential panel 1202, the selection unit 1206 respectively outputs the current selection signal b[4:0] and the switch selection signal D[4:0] to the programmable current source 1105 and the switch unit 1101S. Accordingly, when serving as the color sensor of the LCOS color sequential display system 1200, the light detecting circuit 1100 can set the threshold currents corresponding to the different color beams and turn on or off the corresponding photodiode strings according to the color enable signal and the register table.

In the present embodiment, the light detecting circuit 1100 serving as the color sensor for the red, the green, the blue beams is exemplary, and it does not limit the invention. In other embodiments, the light detecting circuit 1100 may serves as the color sensor for the white, the red, the green, the blue beams.

It should be noted that, in the present embodiment, the light detecting circuit 1100 further includes a small direct-current (DC) bias voltage source $V_{photo}$ coupled to the non-inverting end of the operational amplifier 1103. Accordingly, when the photodiode is the N+/P-Well diode, by the voltage source $V_{photo}$, it is can be avoided that the switches can not be turned off because the negative voltage or other unexpected voltages occur in the negative end of the photodiode.

Figure 13:
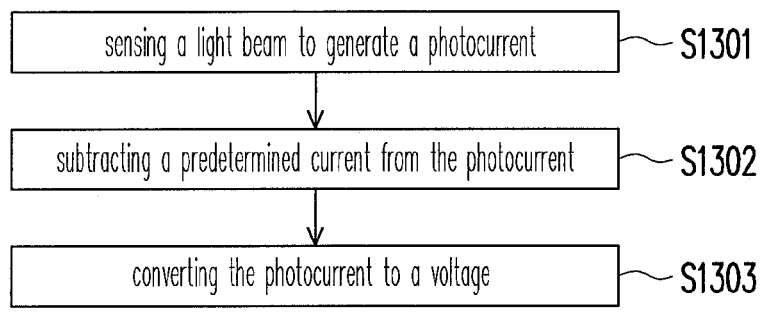
FIG. 13 is a flowchart illustrating a light detecting method according to an embodiment of the invention.

According to the disclosure of the above embodiments, a light detecting method is provided as follows. FIG. 13 is a flowchart illustrating the light detecting method according to an embodiment of the invention. Referring to FIG. 13, in the present embodiment, the light detecting method includes following steps. First of all, a light beam is sensed to generate a photocurrent. In the present embodiment, the light sensor, e.g. a photodiode, is adopted to sense the light beam and correspondingly generates the photocurrent. Next, in step S1302, a predetermined current is subtracted from the photocurrent to obtain a subtracted photocurrent. Those ordinary skilled in the art can determine the predetermined current in any method. For example, the photocurrent is divided by using a current source to execute the step of subtracting the predetermined current from the photocurrent. In step S1303, the subtracted photocurrent is converted to a sensed voltage $V_{sen}$. According to the amount of the sensed voltage $V_{sen}$, the illumination of the sensing light beam is obtained.

Obviously, in another embodiment, the amount of the predetermined current and the amount of the photocurrent may be determined according to a color enable signal and a register table in the light detecting method. In the above-described embodiment, the predetermined current, for example, is generated by a programmable current source, and the light beam, for example, is sensed by a photodiode array.

To sum up, in the embodiments of the invention, the light sensor generates a corresponding photocurrent according to the illumination while being illuminated by the high brightness light beam. By dividing the photocurrent corresponding to the low brightness light beam from the total photocurrent through the current source, the light detecting circuit can mainly detects the high brightness light beam, so that the detecting accuracy can be enhanced. Accordingly, when being applied to detect the high brightness light beam, the light detecting circuit can provide an output voltage in a wide enough range and a large enough sense scale, so that the sensing voltage is easy to be distinguished by the rear stage. Moreover, the light detecting circuit can adjust the threshold currents for the photocurrents corresponding to different color beams while being applied to a color sensor. Accordingly, it is unnecessary to design a plurality of corresponding color sensing circuits for the different color beams, so that the cost of the circuit can be reduced.

Although the invention has been described with reference to the above embodiments, it is apparent to one of the ordinary skill in the art that modifications to the described embodiments may be made without departing from the spirit of the invention. Accordingly, the scope of the invention will be defined by the attached claims not by the above detailed descriptions.

What is claimed is:

1. A light detecting circuit, comprising:
a first resistor having a first end and a second end, and the second end of the first resistor coupled to a first voltage;
a light sensor having a first end and a second end, and the second end of the light sensor coupled to the first voltage;
a first current mirror having a master current end and a slave current end, the slave current end coupled to the first end of the first resistor, and the master current end coupled to the first end of the light sensor, wherein the first end of the first resistor is directly coupled to the slave current end of the first current mirror; and
a current source coupled to the first end of the first resistor and the slave current end of the first current mirror, wherein the current source comprises:
a second resistor having a first end and a second end, and the second end of the second resistor coupled to the first voltage;
a second current mirror having a master current end and a slave current end, and the master current end of the second current mirror coupled to the first end of the second resistor; and
a third current mirror having a master current end and a slave current end, the master current end of the third current mirror coupled to the slave current end of the second current mirror, and the slave current end of the third current mirror coupled to the first end of the first resistor,
wherein a current flowing through the slave current end of the first current mirror is at least partly sank by the slave current end of the third current mirror in the current source.

2. The light detecting circuit as claimed in claim 1, wherein the first current mirror comprises:
a first transistor having a control end, a first end, and a second end, the first end of the first transistor coupled to a second voltage, and the second end of the first transistor serving as the slave current end of the first current mirror; and
a second transistor having a control end, a first end, and a second end, the control end of the second transistor coupled to the control end of the first transistor and the second end of the second transistor, the first end of the second transistor coupled to the second voltage, and the second end of the second transistor serving as the master current end of the first current mirror.

3. The light detecting circuit as claimed in claim 1, wherein the light sensor is a photodiode.

4. A light detecting circuit, comprising:
a first resistor having a first end and a second end;
an operational amplifier having a first input end, a second input end, and an output end, the output end of the operational amplifier coupled to the second end of the first resistor, the first input end of the operational amplifier coupled to a first voltage, and the second input end of the operational amplifier coupled to the first end of the first resistor;
a light sensor having a first end and a second end, the first end of the light sensor coupled to the first end of the first resistor, and the second end of the light sensor coupled to the first voltage; and
a current source coupled to the first end of the light sensor, wherein the current source is a programmable current source, the programmable current source is coupled to the second input end of the operational amplifier to provide a programmable current, and the programmable current source receives a current selection signal from a selection unit to determine an amount of the programmable current,
wherein the light sensor is a photodiode array unit, the photodiode array unit comprises:
a photodiode array comprising a plurality of photodiodes, and the photodiode array coupled to the first voltage to sense different color beams and generate a plurality of photocurrents; and
a switch unit coupled to the first end of the first resistor, and the switch unit receives a switch selection signal from the selection unit to determine a total amount of the photocurrents,
wherein the selection unit receives a color enable signal and respectively outputs the current selection signal and the switch selection signal to the programmable current source and the switch unit according to the color enable signal and a register table to determine the amount of the programmable current and the total amount of the photocurrents, wherein the register table stores parameters of driving the programmable current source and the switch unit corresponding to the different color beams.

5. The light detecting circuit as claimed in claim 4, further comprising a direct-current (DC) bias voltage source, wherein the DC bias voltage source is coupled to the first input end of the operational amplifier.

6. The light detecting circuit as claimed in claim 4, further comprising a feedback capacitor having a first end and a second end, wherein the first end of the feedback capacitor is coupled to the second input end of the operational amplifier, and the second end of the feedback capacitor is coupled to the output end of the operational amplifier.

* * * * *